US012184161B2

(12) United States Patent
Armstrong

(10) Patent No.: US 12,184,161 B2
(45) Date of Patent: Dec. 31, 2024

(54) REDUCED RIPPLE IN SWITCH MODE POWER SUPPLY WITH SNUBBER

(71) Applicant: Advanced Energy Industries, Inc., Fort Collins, CO (US)

(72) Inventor: Mike Armstrong, Loveland, CO (US)

(73) Assignee: Advanced Energy Industries, Inc., Denver, CO (US)

( * ) Notice: Subject to any disclaimer, the term of this patent is extended or adjusted under 35 U.S.C. 154(b) by 434 days.

(21) Appl. No.: 17/491,762

(22) Filed: Oct. 1, 2021

(65) Prior Publication Data

US 2023/0104780 A1  Apr. 6, 2023

(51) Int. Cl.
| | | |
|---|---|---|
| H02M 1/15 | (2006.01) | |
| C23C 14/34 | (2006.01) | |
| C23C 14/35 | (2006.01) | |
| H01J 37/34 | (2006.01) | |
| H02M 1/34 | (2007.01) | |
| H02M 3/158 | (2006.01) | |

(52) U.S. Cl.
CPC .......... *H02M 1/15* (2013.01); *C23C 14/3485* (2013.01); *C23C 14/35* (2013.01); *H01J 37/3405* (2013.01); *H01J 37/3467* (2013.01); *H02M 1/346* (2021.05); *H02M 3/158* (2013.01); *H01J 2237/332* (2013.01)

(58) Field of Classification Search
CPC ............... H01J 37/3405; H01J 37/3467; H01J 2237/332; C23C 14/3485; C23C 14/35; H02M 1/15; H02M 1/346; H02M 1/0067; H02M 1/342; H02M 3/158; H02M 3/156; H02M 7/5387; H02M 7/5395; Y02B 70/10

USPC ..................................................... 204/298.06
See application file for complete search history.

(56) References Cited

U.S. PATENT DOCUMENTS

| | | | |
|---|---|---|---|
| 6,060,776 A | | 5/2000 | Spitz et al. |
| 2005/0248216 A1* | | 11/2005 | Cassel .................... H03K 3/57 307/106 |
| 2020/0313567 A1 | | 10/2020 | Porter, Jr. et al. |

OTHER PUBLICATIONS

Shane Thomas, International Search Report and the Written Opinion of the International Searching Authority, Mar. 30, 2023, PCT/US22/45197, International Searching Authority, Alexandria VA.
Pct, International Preliminary Report on Patentability regarding PCT/US2022/045197, Apr. 11, 2024, 8 pages.

* cited by examiner

*Primary Examiner* — Rodney G McDonald
(74) *Attorney, Agent, or Firm* — Neugeboren O'Dowd PC

(57) ABSTRACT

This disclosure describes systems, methods, and apparatus for reducing ripple in a pulsed waveform power generation system, often for use providing power to a plasma processing chamber. A snubber can be provided between a DC power supply and a switching circuit. A buck converter can also be provided between the snubber and the switching circuit, where the buck converter takes its input from within the snubber and in particular from between a rectifying and capacitive component of the snubber. In this way, the buck converter can be isolated from the DC power supply via an input inductor on a high-input line from the DC power supply.

15 Claims, 11 Drawing Sheets

Existing Ascent Topology

New Ascent Topology

New Ascent Topology

New Ascent Topology

New Ascent Topology

REDUCED RIPPLE IN SWITCH MODE POWER SUPPLY WITH SNUBBER

FIELD OF THE DISCLOSURE

The present disclosure relates generally to power supplies. In particular, but not by way of limitation, the present disclosure relates to systems, methods and apparatuses for plasma processing power supplies with a unique buck converter input.

DESCRIPTION OF RELATED ART

Magnetron sputtering systems are often powered by a pulsed DC power supply, comprising an inverter coupled to the AC mains, a snubber circuit to handle arcing conditions, and a switching circuit to convert the DC from the inverter to a pulsed DC output waveform provided to the plasma load. In the case of the Ascent AP Single Magnetron Sputtering system provided by ADVANCED ENERGY of Fort Collins, Colorado, the pulsed DC power supply further includes a buck converter that pulls power from a node 152 on the high voltage rail 154 between the DC power supply 102 (e.g., an inverter) and an input inductor, $L_{in}$ as shown in FIG. 1. The buck converter provides a variable reverse voltage to the switching circuit to help provide a low-amplitude negative current after each high-amplitude positive pulse. The buck converter includes a switch, Q11, operating at a first frequency, and a switching circuit 110, having switches operating at a second frequency. While such a topology is stable for 100 to 150 kHz output pulses, at lower frequencies, such as 5 to 25 kHz, the voltage on high-input line 154, and current in the input inductor, $L_{in}$, see significant ripple, making it difficult to consistently regulate the output of the DC power supply 102.

There is therefore a need to reduce the voltage ripple on high-input line 154 and reduce the current ripple at input inductor, $L_{in}$.

SUMMARY OF THE DISCLOSURE

The following presents a simplified summary relating to one or more aspects and/or embodiments disclosed herein. As such, the following summary should not be considered an extensive overview relating to all contemplated aspects and/or embodiments, nor should the following summary be regarded to identify key or critical elements relating to all contemplated aspects and/or embodiments or to delineate the scope associated with any particular aspect and/or embodiment. Accordingly, the following summary has the sole purpose to present certain concepts relating to one or more aspects and/or embodiments relating to the mechanisms disclosed herein in a simplified form to precede the detailed description presented below.

Some embodiments of the disclosure may be characterized as a pulsed power converter including a DC voltage input, a DC output, a switching circuit, a snubber circuit, and a buck converter. The snubber circuit can include a rectifying component, a capacitive component, and a node between the rectifying component and the capacitive component. The DC output can be configured to turn a DC waveform DC waveform into a pulsed DC output for provision to the DC output. The snubber circuit can be arranged between the DC voltage input and the switching circuit. The rectifying component can be arranged to pass current for charging the capacitive component from the DC voltage input. The buck converter can be coupled between (1) the first node and (2) the switching circuit.

Other embodiments of the disclosure may also be characterized as a power supply including a constant current power supply, a buck converter, a switching circuit, a voltage absorbing/boosting circuit. The switching circuit can be configured to provide a pulsed output to a plasma load via a single magnetron. The voltage absorbing/boosting circuit can be coupled between the constant current power supply and the switching circuit and can include a rectifying component, a first capacitive component; and a node between the rectifying component and the first capacitive component. The buck converter can be coupled between the node and the buck switch, and the buck switch can be coupled between the buck converter and the switching circuit.

Other embodiments of the disclosure can be characterized as a method of reducing ripple in a snubber of a pulsed power converter. The method can include providing a DC voltage input with constant current, a DC output, a switching circuit, a snubber arranged between the DC voltage input with constant current and the switching circuit, and a buck converter coupled to a node between a rectifying component and a capacitive component of the snubber. The method can also include, providing a constant current to the snubber via the constant current DC voltage input with constant current. The method can also include charging a first capacitive component and a second capacitive component, the first and second capacitive components arranged in series in the snubber. The method can also include charging a third capacitive component in the buck converter via a buck input coupled to a node between the first and second capacitive components. The method can also include applying a voltage stored on the first and second capacitive components to a plasma load via a first configuration of switches in the switching circuit for a first period of a positive pulse cycle. The method can also include applying a voltage stored on the first, but not the second, of the capacitive components to the plasma load via the first configuration of switches in the switching circuit for a second portion of the positive pulse cycle following the first period. The method can also include blocking power from the DC voltage input and the first and second capacitive components to the plasma load via a second configuration of the switches in the switching circuit during a dead period following the second period. The method can also include applying a voltage across a third capacitive component of the buck converter to the plasma load via a third configuration of the switches in the switching circuit during a first period of a negative pulse cycle following the dead period.

BRIEF DESCRIPTION OF THE DRAWINGS

Various objects and advantages and a more complete understanding of the present disclosure are apparent and more readily appreciated by referring to the following detailed description and to the appended claims when taken in conjunction with the accompanying drawings:

DETAILED DESCRIPTION

Figure 1:
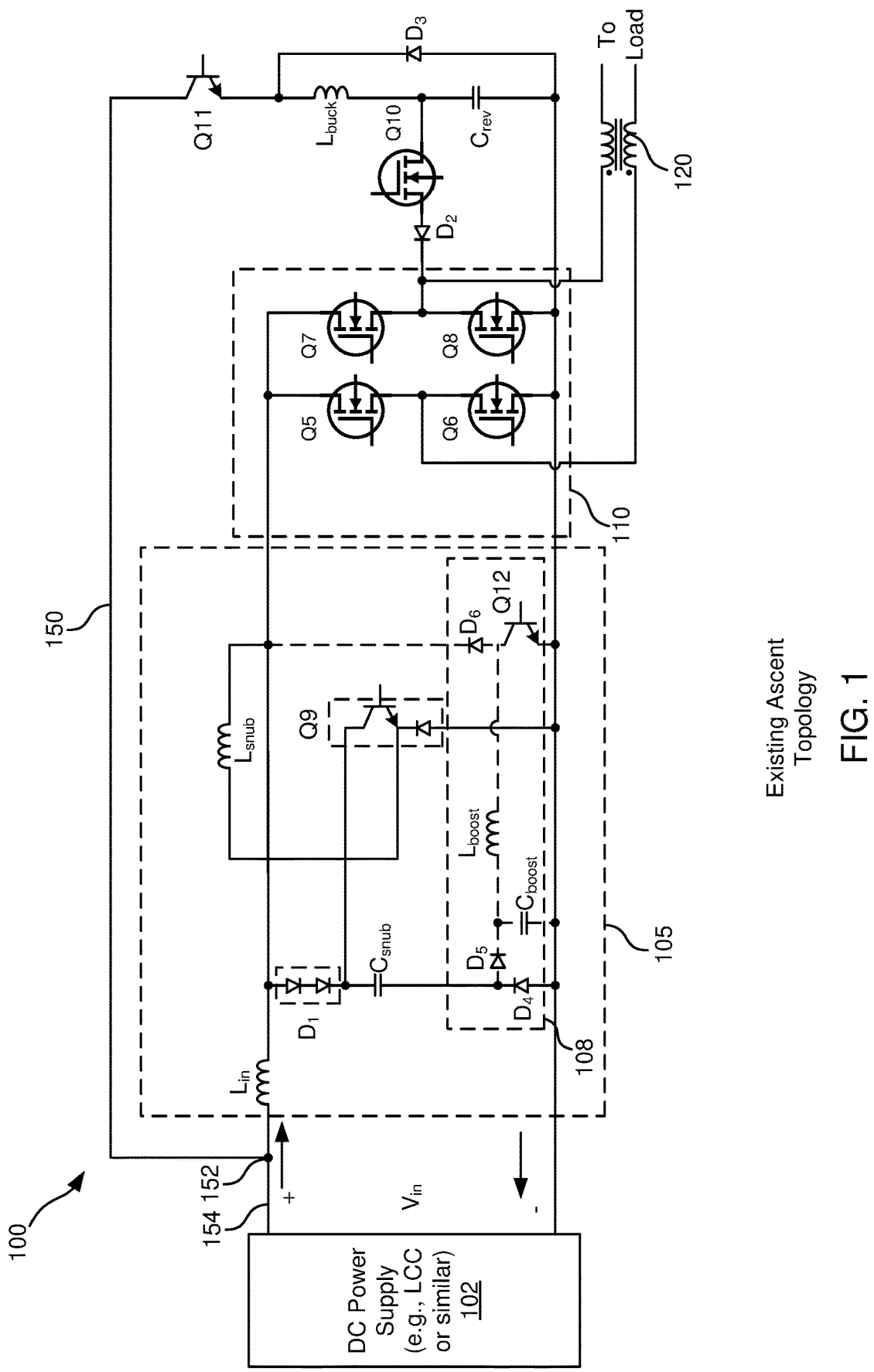
FIG. 1 illustrates an existing magnetron sputtering system where a buck converter input is taken from between a DC power supply and an input inductor.

The present disclosure relates generally to power supplies. More specifically, but without limitation, the present disclosure relates to systems, methods and apparatuses for plasma processing power supplies having a buck converter with a buck input coupled within the snubber rather than to a node preceding the input inductor, $L_{in}$.

The word "exemplary" is used herein to mean "serving as an example, instance, or illustration." Any embodiment described herein as "exemplary" is not necessarily to be construed as preferred or advantageous over other embodiments.

Preliminary note: the flowcharts and block diagrams in the following Figures illustrate the architecture, functionality, and operation of possible implementations of systems, methods and computer program products according to various embodiments of the present disclosure. In this regard, some blocks in these flowcharts or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items, and may be abbreviated as "/".

It will be understood that when an element or component is referred to as being "on," "connected to," "coupled to," or "adjacent to" another element or layer, it can be directly on, connected, coupled, or adjacent to the other element or layer, or intervening elements or layers may be present. In contrast, when an element is referred to as being "directly on," "directly connected to," "directly coupled to," or "immediately adjacent to" another element or layer, there are no intervening elements or layers present.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 illustrates an existing magnetron sputtering system. A DC power supply 102 (e.g., an inverter), provides a DC input voltage, $V_{in}$, at a DC voltage input of a snubber 105, that is converted to a pulsed DC waveform and provided to a load at an output of the switching circuit 110. This load can include a plasma load, and the output can include a choke 120. The conversion from the DC input voltage, $V_{in}$, the pulsed DC waveform, uses a snubber 105, the switching circuit 110, and a buck converter (comprising switch Q11, buck inductor $L_{buck}$, diode $D_3$, reverse voltage capacitor $C_{rev}$, switch Q10, and diode $D_2$. The DC voltage input of a snubber 105 can be a constant current input.

The snubber 105 can be an active snubber, or a circuit configured to absorb excess power and release that stored power to the load at a later time using at least one switch for charging and/or discharging. In the illustrated embodiment, current through the input inductor, $L_{in}$, is directed through optional diode(s), $D_1$, and diode $D_5$ to charge the snubber capacitor, $C_{snub}$, and the boost capacitor, $C_{boost}$. Switch, $Q_9$, is selectively turned on and off to control charging and discharging of the snubber and boost capacitors, $C_{snub}$ and $C_{boost}$. Current discharged from the capacitors, $C_{snubb}$ and $C_{boost}$, leaves the snubber 105 via the boost inductor, $L_{boost}$, and the snubber inductor, $L_{snub}$, to be passed to the switching circuit 110 via the high-input line 154. Selective opening and closing of switch, $Q_{12}$, controls a boost voltage provided to the switching circuit 110, where the boost voltage is greater than the DC input voltage, V. These components of the boost circuit 108, further including diodes, $D_4$ and $D_6$, also contribute to the snubber's 105 ability to provide a boost voltage greater than the DC input voltage, $V_{in}$. In some embodiments, where a variable boost voltage is not needed, the switch, $Q_{12}$, can be replaced with a short or can be left on at all times.

Figure 9:
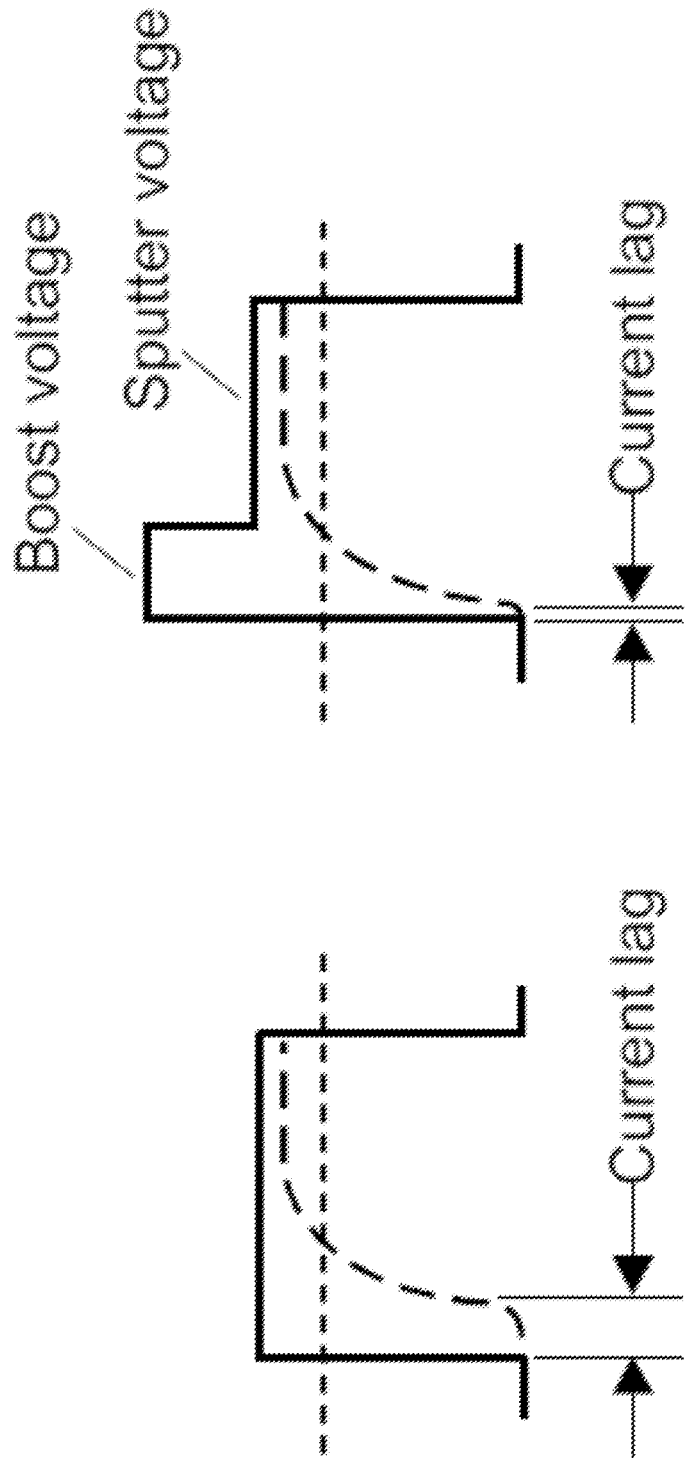
FIG. 9A illustrates a positive pulse without boost with the solid line showing voltage and the dashed lines showing current.
FIG. 9B illustrates the same positive pulse but with boost voltage.

The boost voltage allows an increase in the current slope at the start of each pulse, especially in the presence of high inductive loads. FIG. 9A shows a positive pulse without boost (voltage in the solid and current in the dashed line) and FIG. 9B shows the same positive pulse with boost, where one sees that the boost voltage above the sputter or process voltage increases a rate of current rise as well as reduces a current lag behind the upswing in voltage. This effect is greater in dual magnetron applications, and thus boost functionality may not be utilized in single magnetron applications.

The switching circuit 110 can comprise an h-bridge topology, such as shown in FIG. 1, though dual pairs of full bridges could also be used for greater power handling. The switching circuit 110 is largely responsible for controlling the output voltage waveform, with switches Q5 and Q8 operating in tandem and interleaved with switch Q6 and Q10. Switch Q7 is typically off or open throughout single magnetron operation. In this way, the switching circuit 110 provides positive pulses from the snubber 105 and boost section 108, and negative pulses from the buck converter and switch Q10.

The DC power supply can take the form of a resonant inverter such as an LLC resonant inverter or a three-phase resonant inverter driving an isolating transformer, which can form a three-phase, high frequency rectifier. The input to the DC power supply 102 is a DC voltage that can be obtained from the mains by means of a three-phase passive rectifier, whereas the regulated DC-output to the snubber 105 can reach 1 kV by a diode-capacitor voltage doubler arrangement.

Figure 7:
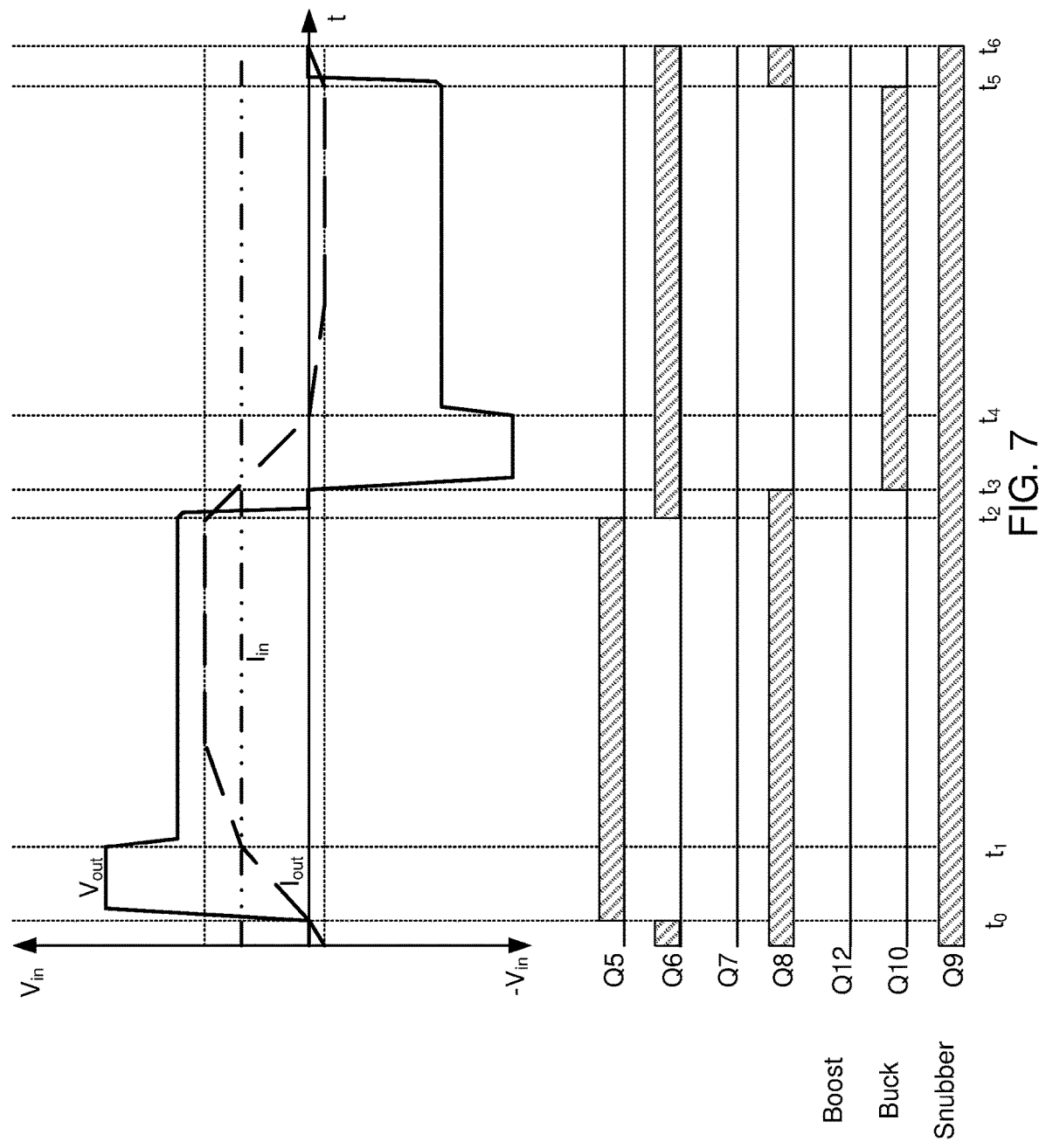
FIG. 7 illustrates a timing chart for the voltage and current output from the switching circuits as well as states of the switches shown in FIGS. 2-5.

The buck converter along with switch Q10 and diode D2 provides a periodic reverse voltage to the output (e.g., see $T_3$-$T_5$ in FIG. 7). This periodic reverse voltage will discharge buildup charges on isolating layers of a substrate being processed or on flakes that form on a magnetron target surface, and proactively inhibit arcs. Isolating layers are typically formed via reactive sputtering or sputtering of a partially conductive material (e.g., ceramics such as AZO).

The buck converter comprises a switch Q11, a buck inductor $L_{buck}$, a diode $D_3$, and a reverse voltage capacitor $C_{rev}$. An output of the buck converter can be taken from between the buck inductor and the reverse voltage capacitor, $C_{rev}$, and can be provided to the load via switch Q10 and diode, $D_2$. The switch Q11 has a duty cycle that controls a charge on the reverse voltage capacitor, $C_{rev}$, and thus in turn this duty cycle controls a reverse voltage pulse applied to the load between positive pulses from the snubber 105. The buck converter is coupled to the high-input line 154 via a buck input 150 coupled to a node 152 on the high-input line 154 between the DC power supply 102 and the input inductor, $L_{in}$. When taken from this node 152, the difference in duty cycles between the switching circuit 110 and the switch Q11, leads to voltage ripple at node 152 and current ripple on input inductor, $L_{in}$, shown for example in FIG. 6A.

Figure 6A:
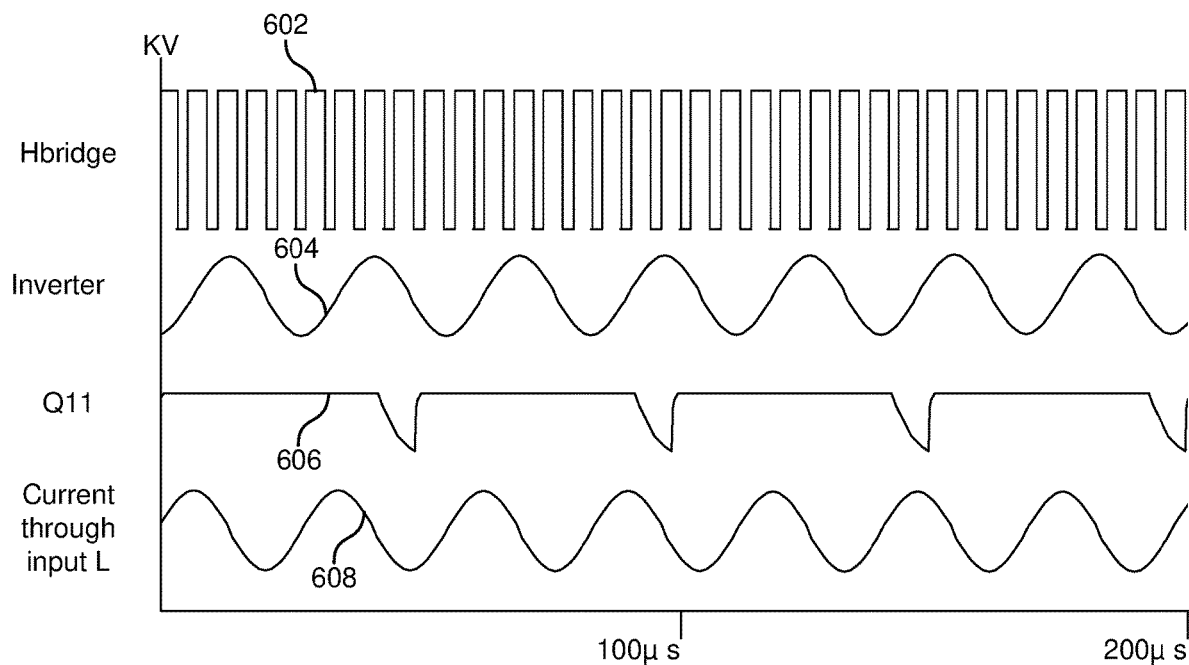
FIG. 6A illustrates timings chart for the voltage in the switching circuit, voltage output from the DC power supply, voltage across switch Q11 in the buck converter, and current in the input inductor, $L_{in}$.

FIG. 6A illustrates a timing chart of the voltage in the switching circuit 602, voltage output from the DC power supply 604, voltage across switch Q11 in the buck converter 606, and current in the input inductor, $L_{in}$ 608. The difference between the duty cycle of the switching circuit 602 and switch Q11 in the buck converter 606 leads to the ripple voltage 604 provided by the DC power supply and the ripple in the current 608 through the input inductor, $L_{in}$.

Figure 2:
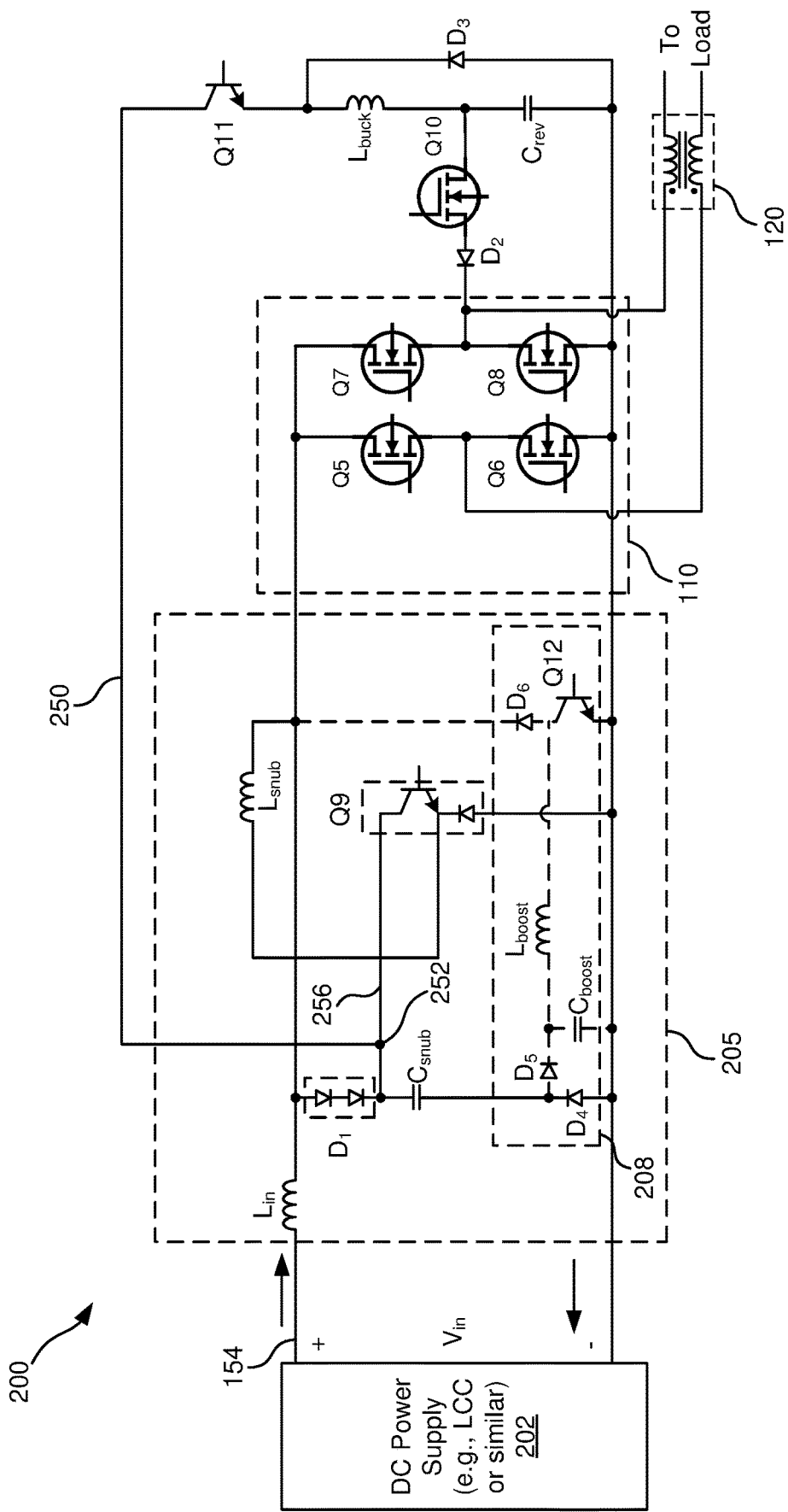
FIG. 2 illustrates a novel magnetron sputtering system where a buck converter input is taken from within a snubber.

To subdue this ripple, the buck converter can instead be isolated from the high-input line 154 and the DC power supply, by being coupled within the snubber as shown in FIG. 2. More specifically, the buck input line 250 can be coupled to a node 252 between the diode(s), $D_1$, the snubber capacitor, $C_{snub}$, and the switch Q9. The input inductor, $L_{in}$, as well as the diode(s) $D_1$ provide isolation and rectification that greatly reduce the ripple seen on the high-input line 154.

FIG. 6B again shows timing charts for the switching circuit voltage 602, the DC power supply output voltage 604, voltage across switch Q11 606 in the buck converter, and current 608 through the input inductor, $L_{in}$, but for the topology shown in FIG. 2-5. One can see that moving the input line 250 of the buck converter to an isolated location within the snubber greater reduces the voltage and current ripple seen in FIG. 6A associated and corresponding to the topology in FIG. 1.

Figure 3:
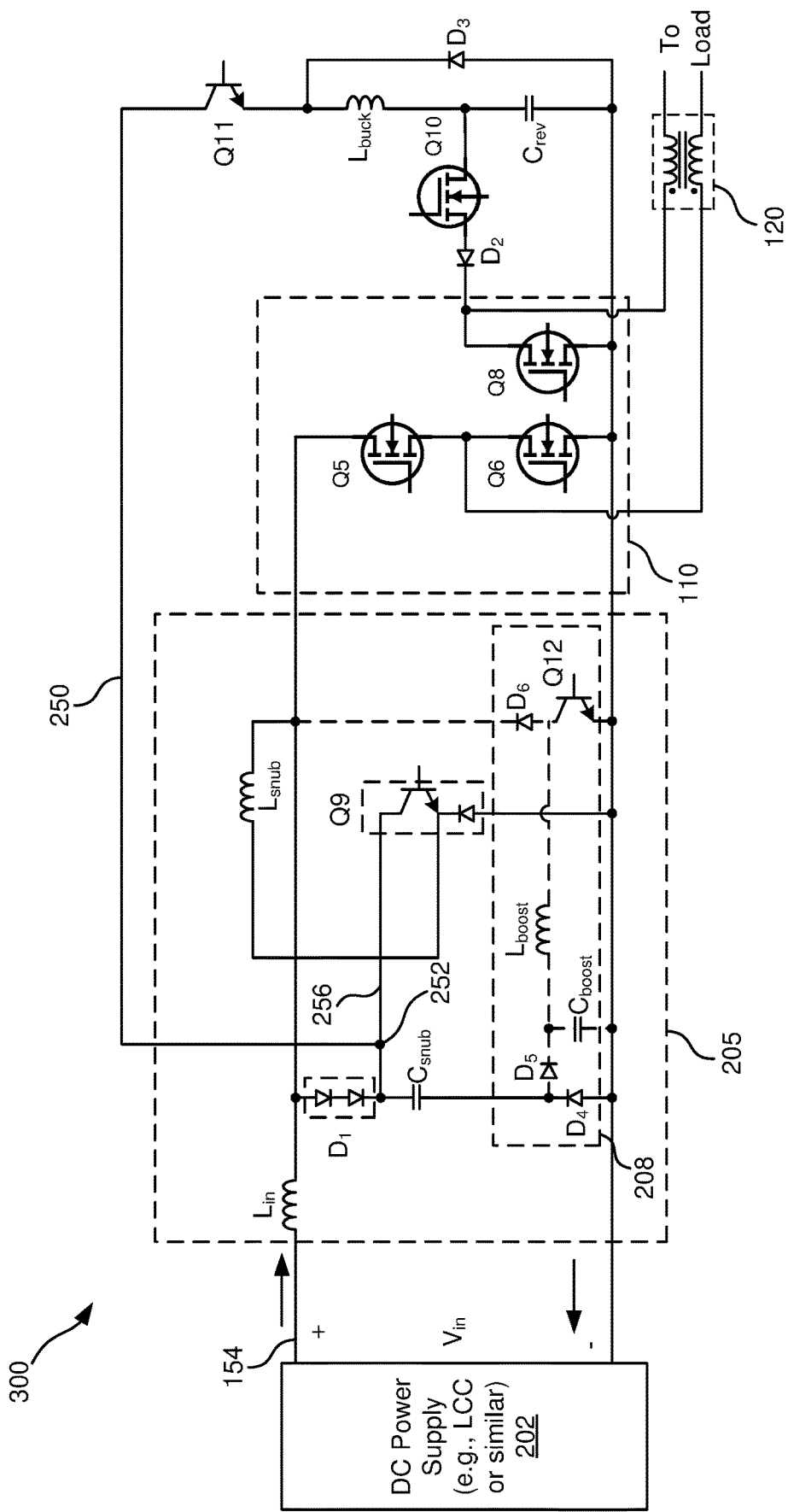
FIG. 3 illustrates a variation on the magnetron sputtering system shown in FIG. 2.
Figure 5:
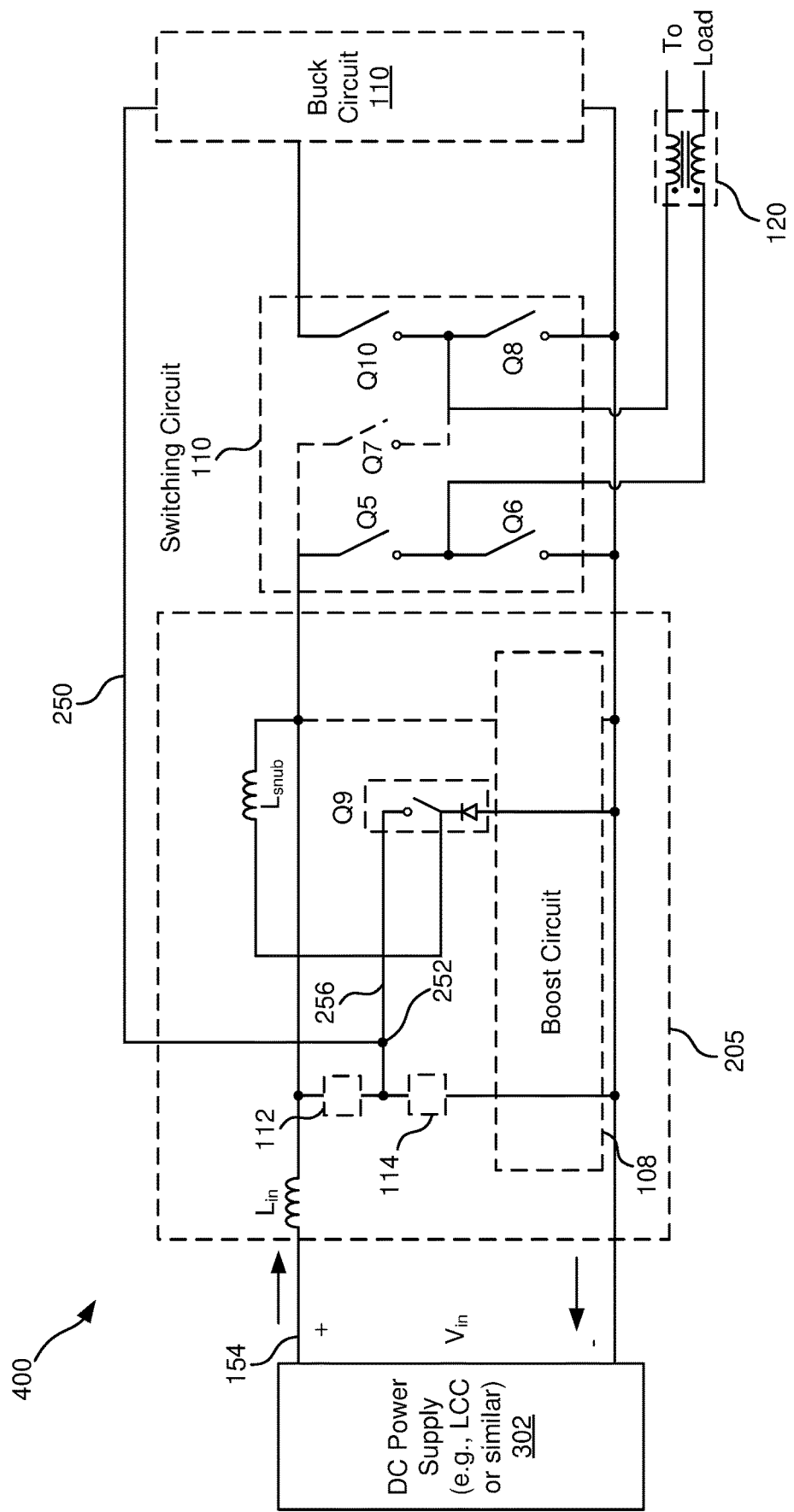
FIG. 5 illustrates yet another variation on the magnetron sputtering system shown in FIG. 2.
Figure 6B:
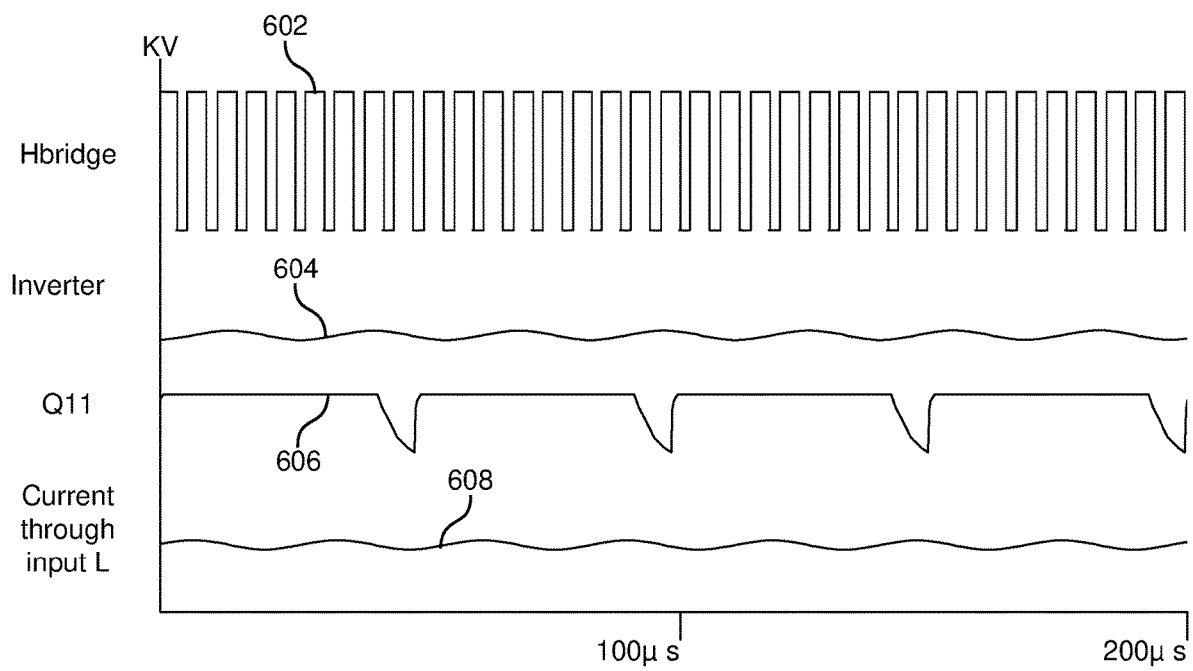
FIG. 6B again shows timing charts for the switching circuit voltage, the DC power supply output voltage, voltage across switch Q11 in the buck converter, and current through the input inductor, $L_{in}$, but for the topology shown in FIG. 2-5.

Because the switch Q7 in the switching circuit 210 is held off/open for single magnetron operation, in some embodiments, this switch Q7 can be removed as shown in FIG. 3. In a way, the topology of FIG. 3 acts as a switching circuit with the switch Q10 inside the switching circuit and the switch Q7 being optional or removed from the switching circuit, as shown in the variation of FIG. 5. In this variation, a rectifying component 112 is arranged between the input inductor, $L_{in}$, and a capacitive component 114. The functionality of the boost circuit 108 is optional, though the passive components shown in FIGS. 2-3 are included. A buck converter 110 is shown between the buck input line 250 and the switch Q10, and various buck topologies can be implemented. The choke 120 is shown but is optional. Although switch Q9 is shown, if operation does not require switching of Q9, then this can be replaced with a short or just the diode that is shown as part of switch Q9.

Figure 4:
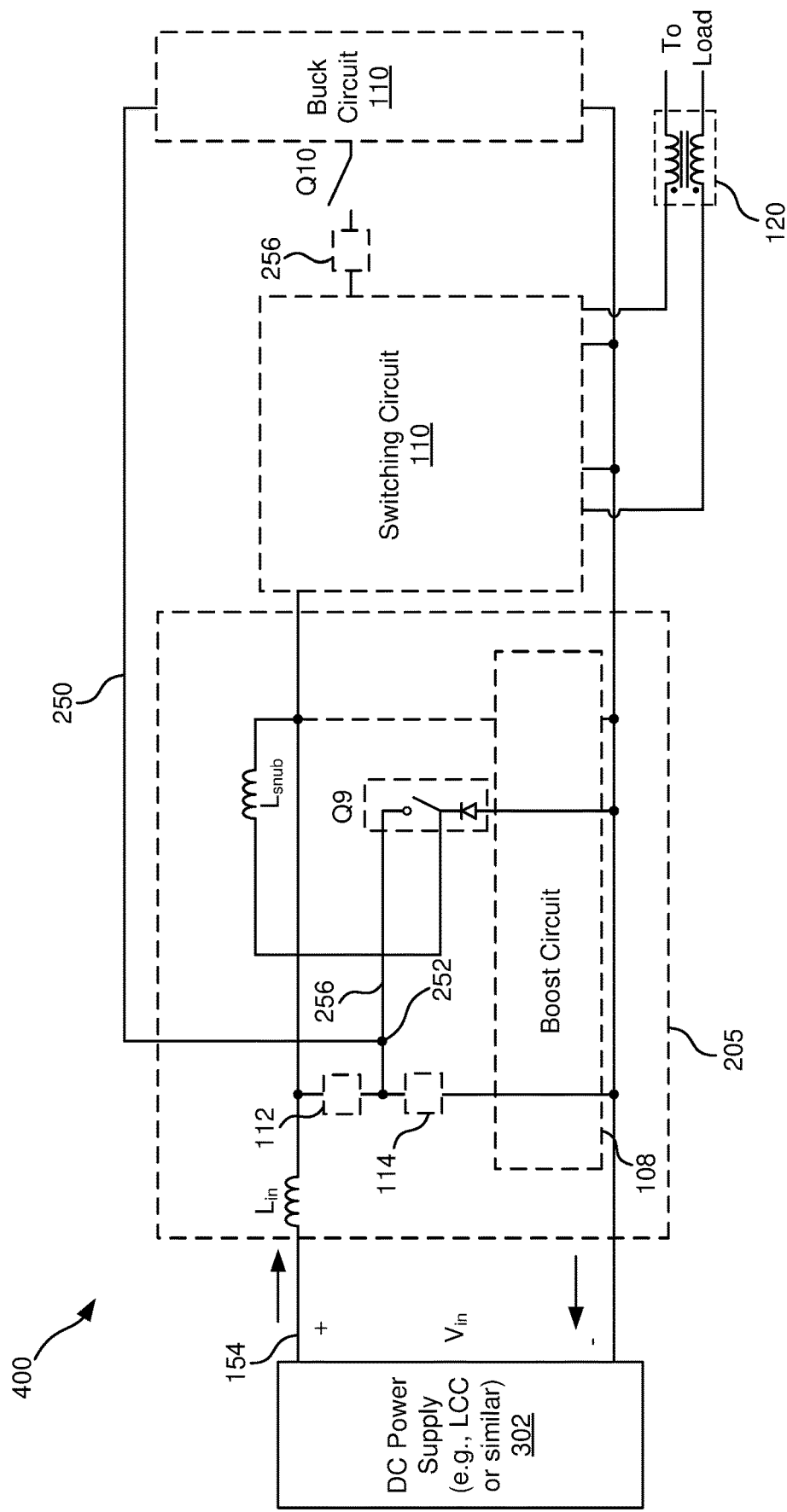
FIG. 4 illustrates another variation on the magnetron sputtering system shown in FIG. 2.

FIG. 4 illustrates another embodiment of a magnetron sputtering system. This system 400 includes a DC power supply 302 (e.g., an inverter such as a resonant LLC converter), a snubber 205 with boost topology 108, a switching circuit 110, a buck converter 110, a switch Q10, and a rectifying component 256. The output of the switching circuit 110 is provided to a load, such as a plasma load, and the two output lines can be coupled via an optional choke 120. The snubber 205 receives the DC voltage, $V_{in}$, via an input inductor, $L_{in}$, which then charges a capacitive component 114 and a capacitive component of the boost circuit 108 via a rectifying component 112 (allowing current to pass downward in the figure). Charging of the capacitive components temporarily increases a voltage provided to the switching circuit 110 (via the snubber inductor, $L_{snub}$ for instance), and in turn helps to ramp current more quickly at a start of each pulse provided by the switching circuit 110 to the load. The switching circuit 110 not only receives power from the snubber 205, but also from the buck converter 110, which provides a periodic reverse voltage having a similar voltage to positive pulses provided via the snubber, but a lower amplitude current. The buck converter 110 draws power from inside the snubber 205 via the buck converter input line 250, which is coupled to a node 252 between the rectifying component 112, the capacitive component 114, and the switch Q9. Drawing power from within the snubber 108 helps isolate the DC power supply 302 from the buck converter 110 and thereby reduce voltage ripple on the high-input line 154 and current ripple in the input inductor, $L_{in}$. Energy stored in the buck converter 110 is provided to the switching circuit 110 and delivered to the load as controlled by the duty cycle of the switch Q10 and the rectifying component 256 (allowing current to pass to the left in the figure).

Figure 8:
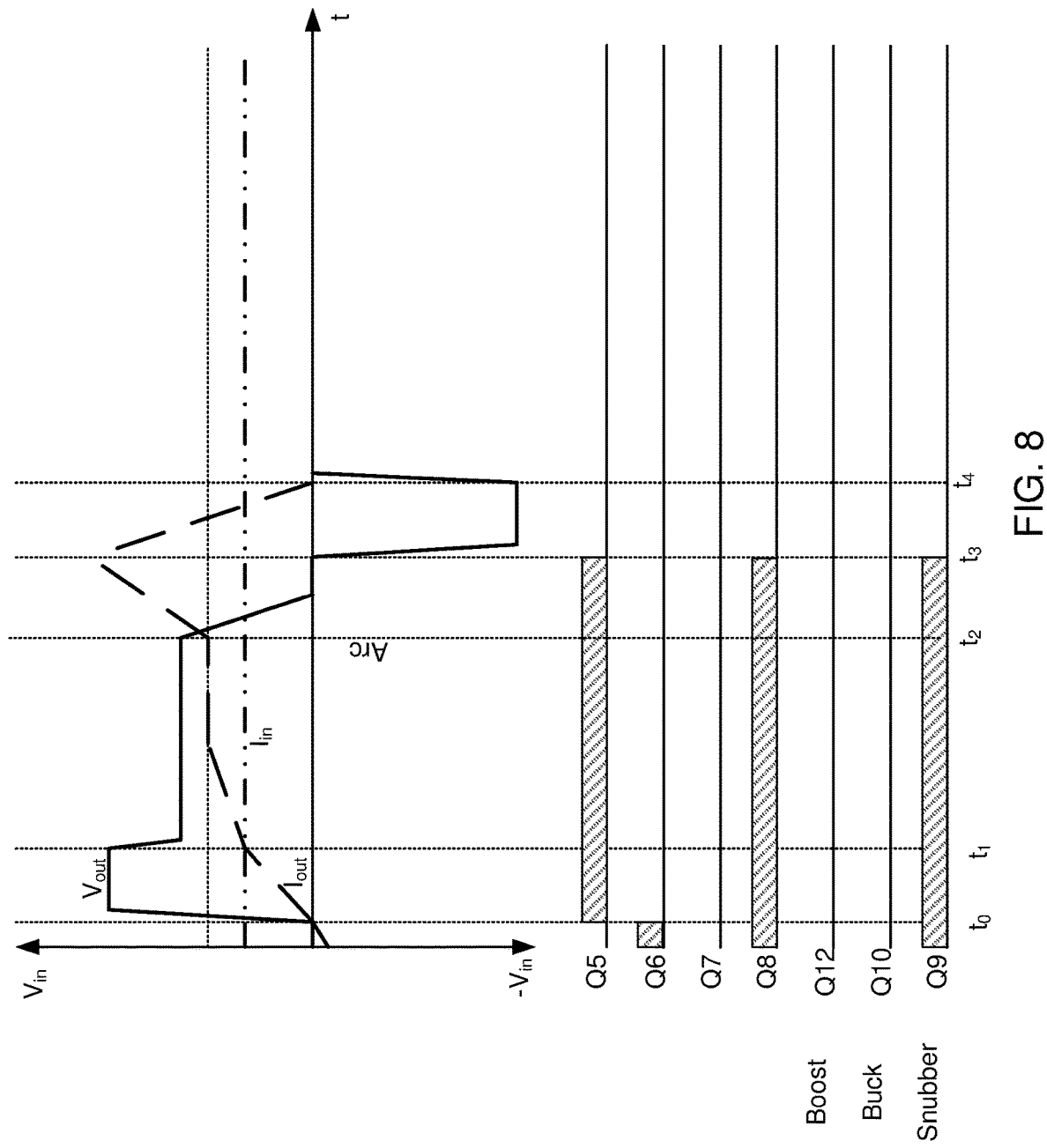
FIG. 8 illustrates a timing chart for the voltage and current output from the switching circuits as well as states of the switches shown in FIGS. 2-5 when an arc occurs.

FIG. 7 illustrates a timing chart for the voltage and current output from the switching circuits as well as states of the switches shown in FIGS. 2-5. This operation follows normal pulsed operation, while FIG. 8 illustrates operation during an arc. Output voltage is shown in a solid line, output current in a dashed line, and input current to the snubber is shown in a dot and dashed line. The following discussion will reference FIG. 2, although much of this discussion equally applies to FIGS. 3-5. Dead times between pulses (e.g., 0 to $t_0$, $t_2$ to $t_3$ and $t_5$ to $t_6$) are provided between positive and negative pulses, two of which are shown in this time frame. The positive pulse can be seen between $t_0$ and $t_2$ and the negative pulse between $t_3$ and $t_5$. Both pulses see a boosted voltage region at a start of each pulse (e.g., $t_0$ to $t_1$ and $t_3$ to $t_4$). For the positive pulse this is causes by closing of Q5 and Q8 in the switching circuit, which provides the full snubber voltage to the load. This boosted voltage helps to increase a ramp rate of the current (dashed line) as well as reduce a lag between a start of the voltage ramping and start of the current ramping in each pulse. After the boost voltage portion, $t_1$ and $t_4$, the voltage drops back to a process voltage and the output current soon approaches a steady state. This voltage reduction is a passive result of the snubber topology and is not associated with any active switching in the snubber or switching circuit (as all switches remain in their previous states through this voltage reduction). At an end of each pulse, the voltage drops at $t_2$ and $t_5$ and the current quickly follows thereafter with the boost voltage helping to pull the current toward 0 A. The end of the positive pulse is brought about by the opening of Q5 and the closing of Q6 to pull the voltage down, while Q8 remains on/closed to hold the voltage at 0V. Then Q8 is opened and Q10 is closed to allow the periodic reverse voltage from the buck converter to begin pulling the voltage negative and to continue pulling the current toward 0 A. Q6 and Q10 remain closed/on during the negative pulse, and then Q10 is opened at the end of the negative pulse to cut power delivery from the buck converter. Q6 remains closed/on to hold voltage at 0V, until the end of the dead time and a start of a next positive pulse. During all of the above, the switch Q7 is off/open and switch Q9 is on/closed. Thus, in some embodiments, Q7 can be replaced by an open and, where arc mitigation functionality of the snubber is not used, switch Q9 can be replaced by a short.

FIG. 8 illustrates a timing chart for the voltage and current output from the switching circuits as well as states of the switches shown in FIGS. 2-5 when an arc occurs. In this timing chart an arc occurs at $t_2$, during the processing voltage of the positive pulse. With the arc forming a partial short in the plasma processing chamber, the current begins to ramp steeply while the voltage quickly drops to 0V. Upon detection, at $t_3$, the switches Q5 an Q8 are prematurely turned off/opened, and the snubber switch, Q9, is also opened. This prevents further discharge of energy stored in the snubber toward the plasma load and also cuts off the high-input line 154 from the load. With power nearly instantly cut off from the choke 120 and the plasma chamber, which act as an inductor, voltage flips in order to maintain current, and this negative voltage quickly pulls the current toward 0 A. By $t_4$ the current has reached 0 A, the arc has been extinguished, and the voltage falls toward 0V.

Figure 10:
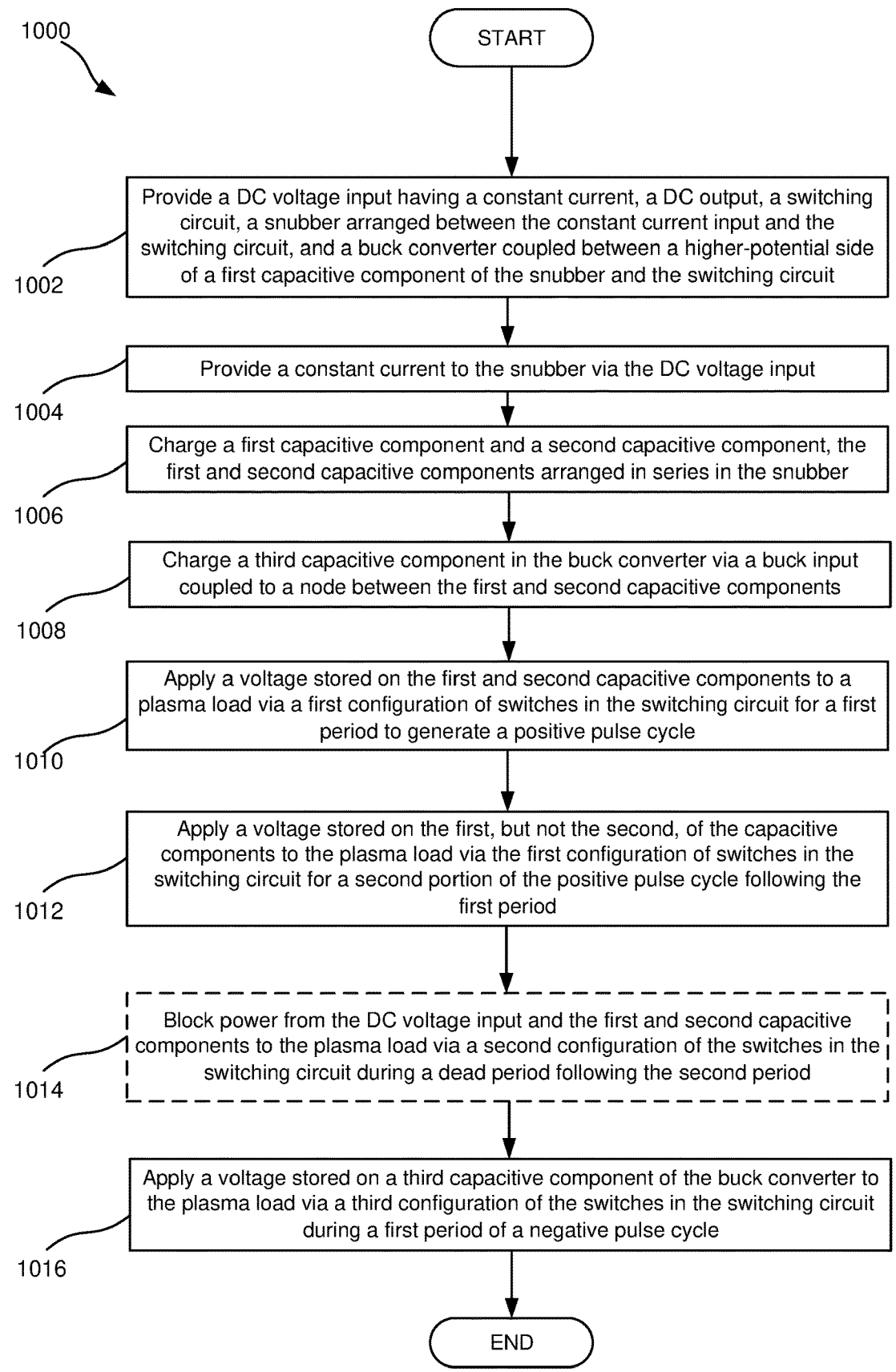
FIG. 10 illustrates a method of reducing ripple in a snubber of a pulsed power converter.

FIG. 10 illustrates a method of reducing ripple in a snubber of a pulsed power converter.

The method 1000 includes providing a DC voltage input having a constant current, a DC output, a switching circuit, a snubber arranged between the constant current input and the switching circuit, and a buck converter coupled between a higher-potential side of a first capacitive component of the snubber and the switching circuit (Block 1002). The method also includes providing a constant current to the snubber via the constant current DC voltage input (Block 1004), and charging a first capacitive component (e.g., $C_{snub}$) and a second capacitive component (e.g., $C_{boost}$) of the snubber (Block 1006). The first and second capacitive components are arranged in series in the snubber, though their arrangement with rectifying components such as diodes (e.g., $D_1$ and $D_5$) leads to charging of the first and second capacitive components in series and discharge in parallel. The method further includes charging a third capacitive component (e.g., $C_{rev}$) in the buck converter via a buck input coupled to a node between the first and second capacitive components (e.g., node 252 in FIG. 2) (Block 1008). The method can yet further include applying a voltage stored on the first and second capacitive components to a plasma load via a first configuration of switches in the switching circuit for a first period to generate a positive pulse cycle (e.g., Q5 and Q8 are on/closed during $t_0$ to $t_1$ in FIG. 7) (Block 1010). The method can also include applying a voltage stored on the first, but not the second, of the capacitive components to the plasma load via the first configuration of switches in the switching circuit for a second portion of the positive pulse cycle following the first period (Block 1012). For instance, in FIG. 7 one sees that Q5 and Q8 remain on even as the voltage drops from the boost voltage to the process voltage, and this is a byproduct of the snubber 205 supplying energy from both $C_{snub}$ and $C_{boost}$ between to and $t_1$, but supplying energy from $C_{snub}$ during $t_1$ to $t_2$. In other words, a voltage drop across the first capacitive component, $C_{snub}$, and a second capacitive component, $C_{boost}$, in series with the first capacitive component, $C_{snub}$, boosts a voltage at the DC output during an initial period of each positive pulse cycle. Said yet another way, the boost in voltage between to and tris a result of the input current at 154 being greater than the output current to the switching circuit 110, resulting in voltage provided to the switching circuit 110 increasing to equal the sum of the $C_{snub}$ voltage plus the $C_{boost}$ voltage. The method 1000 can further include optionally, where a dead time in the output waveform is used, blocking power from the DC voltage input and the first and second capacitive components to the plasma load via a second configuration of the switches in the switching circuit during a dead period following the second period (Block 1014). The method can further include applying a voltage stored on the third capacitive component of the buck converter to the plasma load via a third configuration of the switches in the switching circuit during a first period of a negative pulse cycle (Block 1016).

Figure 11:
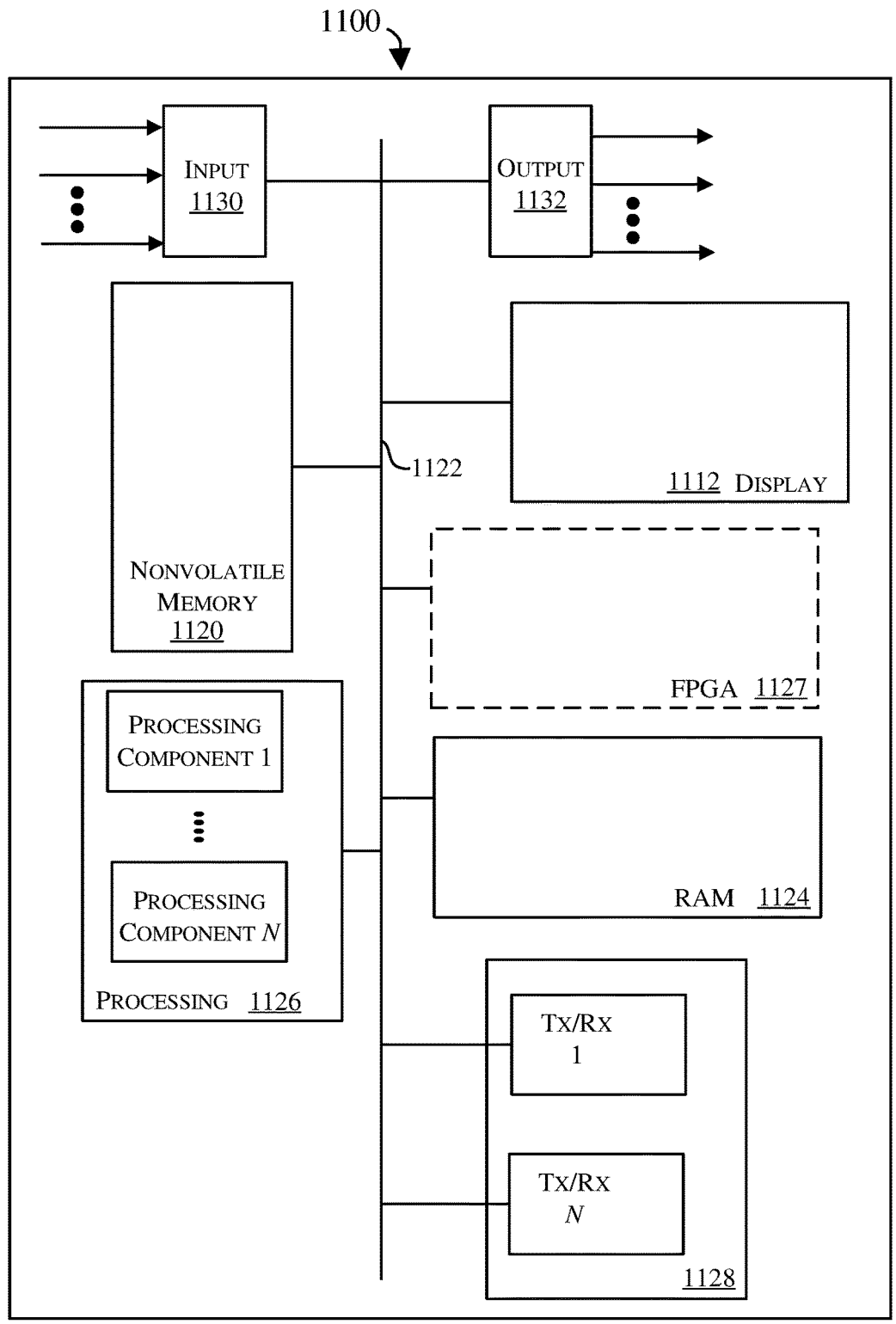
FIG. 11 a block diagram depicting physical components that may be utilized to realize a controller of the switches shown in FIGS. 2-5 according to an exemplary embodiment.

The methods described in connection with the embodiments disclosed herein may be embodied directly in hardware, in processor-executable code encoded in a non-transitory tangible processor readable storage medium, or in a combination of the two. Referring to FIG. 11 for example, shown is a block diagram depicting physical components that may be utilized to realize a system for reducing ripple in a snubber of a pulsed power converter (and the controller of the various switches within the snubber and buck converter generally) according to an exemplary embodiment. As shown, in this embodiment a display portion 1112 and nonvolatile memory 1120 are coupled to a bus 1122 that is also coupled to random access memory ("RAM") 1124, a processing portion (which includes N processing components) 1126, an optional field programmable gate array (FPGA) 1127, and a transceiver component 1128 that includes N transceivers. Although the components depicted in FIG. 11 represent physical components, FIG. 11 is not intended to be a detailed hardware diagram; thus, many of the components depicted in FIG. 11 may be realized by common constructs or distributed among additional physical components. Moreover, it is contemplated that other existing and yet-to-be developed physical components and architectures may be utilized to implement the functional components described with reference to FIG. 11.

This display portion 1112 generally operates to provide a user interface for a user, and in several implementations, the display is realized by a touchscreen display. In general, the nonvolatile memory 1120 is non-transitory memory that functions to store (e.g., persistently store) data and processor-executable code (including executable code that is associated with effectuating the methods described herein). In some embodiments for example, the nonvolatile memory 1120 includes bootloader code, operating system code, file system code, and non-transitory processor-executable code to facilitate the execution of a method described with reference to FIG. 10 described further herein.

In many implementations, the nonvolatile memory 1120 is realized by flash memory (e.g., NAND or ONENAND memory), but it is contemplated that other memory types may be utilized as well. Although it may be possible to execute the code from the nonvolatile memory 1120, the executable code in the nonvolatile memory is typically loaded into RAM 1124 and executed by one or more of the N processing components in the processing portion 1126.

The N processing components in connection with RAM 1124 generally operate to execute the instructions stored in nonvolatile memory 1120 to enable methods of reducing ripple in a snubber of a pulsed power converter. For example, non-transitory, processor-executable code to effectuate the methods described with reference to FIG. 10 may be persistently stored in nonvolatile memory 1120 and executed by the N processing components in connection with RAM 1124. As one of ordinarily skill in the art will appreciate, the processing portion 1126 may include a video processor, digital signal processor (DSP), micro-controller, graphics processing unit (GPU), or other hardware processing components or combinations of hardware and software processing components (e.g., an FPGA or an FPGA including digital logic processing portions).

In addition, or in the alternative, the processing portion 1126 may be configured to effectuate one or more aspects of the methodologies described herein (e.g., the method described with reference to FIG. 10). For example, non-transitory processor-readable instructions may be stored in the nonvolatile memory 1120 or in RAM 1124 and when executed on the processing portion 1126, cause the processing portion 1126 to perform methods of reducing ripple in a snubber of a pulsed power converter. Alternatively, non-transitory FPGA-configuration-instructions may be persistently stored in nonvolatile memory 1120 and accessed by the processing portion 1126 (e.g., during boot up) to configure the hardware-configurable portions of the processing portion 1126 to effectuate the functions of the controller of the switches of the snubber and buck converter.

The input component 1130 operates to receive signals (e.g., the control signals to the switches of the snubber and buck converter) that are indicative of one or more aspects of the controller of the switches of the snubber and buck converter. The signals received at the input component may include, for example, digital high and low signals, or analogue high and low signals. The output component generally operates to provide one or more analog or digital signals to effectuate an operational aspect of the switches of the snubber and buck converter. For example, the output portion 1132 may provide control of the switch Q9 and the switch Q12 described with reference to FIG. 2.

The depicted transceiver component 1128 includes N transceiver chains, which may be used for communicating with external devices via wireless or wireline networks. Each of the N transceiver chains may represent a transceiver associated with a particular communication scheme (e.g., Wi-Fi, Ethernet, Profibus, etc.).

Some portions are presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm is a self-consistent sequence of operations or similar processing leading to a desired result. In this context, operations or processing involves physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, it is appreciated that throughout this specification discussions utilizing terms such as "processing," "computing," "calculating," "determining," and "identifying" or the like refer to actions or processes of a computing device, such as one or more computers or a similar electronic computing device or devices, that manipulate or transform data represented as physical electronic or magnetic quantities within memories, registers, or other information storage devices, transmission devices, or display devices of the computing platform.

The terms and expressions employed herein are used as terms and expressions of description and not of limitation, and there is no intention, in the use of such terms and expressions, of excluding any equivalents of the features shown and described or portions thereof. Each of the various elements disclosed herein may be achieved in a variety of manners. This disclosure should be understood to encompass each such variation, be it a variation of an embodiment of any apparatus embodiment, a method or process embodiment, or even merely a variation of any element of these. Particularly, it should be understood that the words for each element may be expressed by equivalent apparatus terms or method terms—even if only the function or result is the same. Such equivalent, broader, or even more generic terms should be considered to be encompassed in the description of each element or action. Such terms can be substituted where desired to make explicit the implicitly broad coverage to which this invention is entitled.

As but one example, it should be understood that all action may be expressed as a means for taking that action or as an element which causes that action. Similarly, each physical element disclosed should be understood to encompass a disclosure of the action which that physical element facilitates. Regarding this last aspect, by way of example only, the disclosure of a "protrusion" should be understood to encompass disclosure of the act of "protruding"—whether explicitly discussed or not—and, conversely, were there only disclosure of the act of "protruding", such a disclosure should be understood to encompass disclosure of a "protrusion". Such changes and alternative terms are to be understood to be explicitly included in the description.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

As used herein, the recitation of "at least one of A, B and C" is intended to mean "either A, B, C or any combination of A, B and C." The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

What is claimed is:

1. A pulsed power converter comprising:
   a DC voltage input;
   a DC output configured for coupling to a plasma load;
   a switching circuit configured to turn a DC waveform into a pulsed DC output for provision to the DC output;
   a snubber circuit arranged between the DC voltage input and the switching circuit, the snubber circuit comprising:
      a rectifying component;
      a capacitive component; and
      a node between the rectifying component and the capacitive component, wherein
      the rectifying component is arranged to pass current for charging the capacitive component from the DC voltage input; and
   a buck converter coupled between (1) the node and (2) the switching circuit.

2. The pulsed power converter of claim 1, further comprising a buck switch between the buck converter and the switching circuit, the buck switch configured to bias the plasma load with stored energy from the buck converter during negative pulse cycles.

3. The pulsed power converter of claim 2, wherein the switching circuit comprises at least three switches, two of these at least three switches providing positive pulse cycles of the DC output, and a third of these at least three switches in combination with the buck switch configured to provide negative pulse cycles of the DC output.

4. The pulsed power converter of claim 1, wherein the buck converter is coupled to the switching circuit via a buck switch and wherein the buck switch operates at a different frequency than the switching circuit, leading to ripple at the DC voltage input that is mitigated by the buck converter being coupled to the node rather than the DC voltage input.

5. The pulsed power converter of claim 1, wherein a path to the plasma load includes a single magnetron plasma processing electrode.

6. The pulsed power converter of claim 1, wherein a voltage drop across the first capacitive component and a second capacitive component in series with the first capacitive component boosts a voltage at the DC output during an initial period of each positive pulse cycle.

7. The pulsed power converter of claim 1, wherein the rectifying component is a diode, or series of diodes, and the capacitive component is a capacitor.

8. A power supply comprising:
   a constant current power supply;
   a buck converter;
   a switching circuit configured to provide a pulsed output to a plasma load via a single magnetron; and
   a voltage absorbing/boosting circuit coupled between the constant current power supply and the switching circuit and comprising:
      a rectifying component;
      a first capacitive component; and
      a node between the rectifying component and the first capacitive component;
   wherein the buck converter is coupled between the node and a buck switch, the buck switch coupled between the buck converter and the switching circuit.

9. The power supply of claim 8, wherein the voltage absorbing/boosting circuit is coupled to a first switch of the switching circuit.

10. The power supply of claim 8, wherein the capacitive component is configured to bias the plasma load during positive pulse cycles.

11. The power supply of claim 8, wherein the buck switch is configured to bias the plasma load with stored energy from the buck converter during negative pulse cycles.

12. The power supply of claim 11, wherein the switching circuit comprises at least three switches, two of these at least three switches configured to provide positive pulse cycles to the plasma load, and a third of these at least three switches in combination with the buck switch configured to provide the negative pulse cycles to the plasma load.

13. The power supply of claim 8, wherein the buck converter is coupled to the switching circuit via a buck switch and wherein the buck switch operates at a different frequency than the switching circuit, leading to ripple at the constant current power supply that is mitigated by the buck converter being coupled to the first node rather than an output of the constant current power supply.

14. The power supply of claim 8, wherein a voltage drop across the first capacitive component and a second capacitive component in series with the first capacitive component boosts a voltage to the plasma load during an initial period of each positive pulse cycle.

15. The power supply of claim 8, wherein the rectifying component is a diode, or series of diodes, and the capacitive component is a capacitor.

* * * * *